(12) United States Patent
Lindley et al.

(10) Patent No.: US 11,618,946 B2
(45) Date of Patent: Apr. 4, 2023

(54) METHOD OF MONITORING A SURFACE CONDITION OF A COMPONENT

(71) Applicant: Watlow Electric Manufacturing Company, St. Louis, MO (US)

(72) Inventors: Jacob Lindley, St. Louis, MO (US); Philip Schmidt, St. Louis, MO (US); Miranda Pizzella, St. Louis, MO (US); Mark D. Everly, St. Charles, MO (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 0 days.

(21) Appl. No.: 17/306,200

(22) Filed: May 3, 2021

(65) Prior Publication Data

US 2021/0340669 A1 Nov. 4, 2021

Related U.S. Application Data

(60) Provisional application No. 63/019,267, filed on May 2, 2020.

(51) Int. Cl.
*G01N 25/20* (2006.01)
*G06Q 10/04* (2012.01)
(Continued)

(52) U.S. Cl.
CPC ......... *C23C 16/4401* (2013.01); *G01N 25/20* (2013.01); *G06Q 10/04* (2013.01); *G06Q 50/04* (2013.01)

(58) Field of Classification Search
CPC .... C23C 16/4401; G01N 25/20; G06Q 10/04; G06Q 50/04
See application file for complete search history.

(56) References Cited

U.S. PATENT DOCUMENTS 9,888,526 B2 2/2018 Faulkner et al.
10,134,569 B1 11/2018 Albarede et al.
(Continued)

FOREIGN PATENT DOCUMENTS

CN 101572219 11/2009
JP H11258188 9/1999
(Continued)

OTHER PUBLICATIONS

Dr. Lim Soo King, Jul. 29, 2012, UEEP2613 Microelectronic Fabrication, Metallization Chapter 8 Pages, pp. 194-213 (Year: 2012).*

(Continued)

*Primary Examiner* — Natalie Huls
*Assistant Examiner* — Sharad Timilsina
(74) *Attorney, Agent, or Firm* — Burris Law, PLLC

(57) ABSTRACT

A method includes providing thermal energy to a component, determining a thermal response of the component in response to providing the thermal energy, and determining a thermal characteristic of the component based on a reference thermal response and the thermal response. The method includes predicting a surface condition of the component based on the thermal characteristic and a predictive analytic model, where the predictive analytic model correlates the thermal characteristic of the component to an estimated surface condition of the component.

17 Claims, 7 Drawing Sheets

(51) Int. Cl.
*G06Q 50/04* (2012.01)
*C23C 16/44* (2006.01)

(56) References Cited

U.S. PATENT DOCUMENTS

| | | | |
|---|---|---|---|
| 10,352,745 | B2 | 7/2019 | Easey et al. |
| 2002/0011204 | A1* | 1/2002 | Gujer ................. C23C 16/4586 |
| | | | 118/500 |
| 2011/0284029 | A1 | 11/2011 | Baseman et al. |
| 2018/0066940 | A1* | 3/2018 | Sopori ................. G01N 15/088 |
| 2019/0122911 | A1* | 4/2019 | Briggs ..................... G06N 5/04 |
| 2021/0022212 | A1 | 1/2021 | Cimino et al. |

FOREIGN PATENT DOCUMENTS

| | | |
|---|---|---|
| JP | 5589151 B1 | 9/2014 |
| JP | 6800074 B2 | 12/2020 |
| WO | 2007041454 | 4/2007 |
| WO | 2015156923 A1 | 10/2015 |
| WO | 2016142864 | 9/2016 |
| WO | 2019226462 A1 | 11/2019 |
| WO | 2020229810 A1 | 11/2020 |

OTHER PUBLICATIONS

Search Report issued in corresponding TW Application No. 110115915, dated Mar. 25, 2022, 1 page.
International Search Report for International Application PCT/US2021/030439, dated Aug. 9, 2021.

* cited by examiner

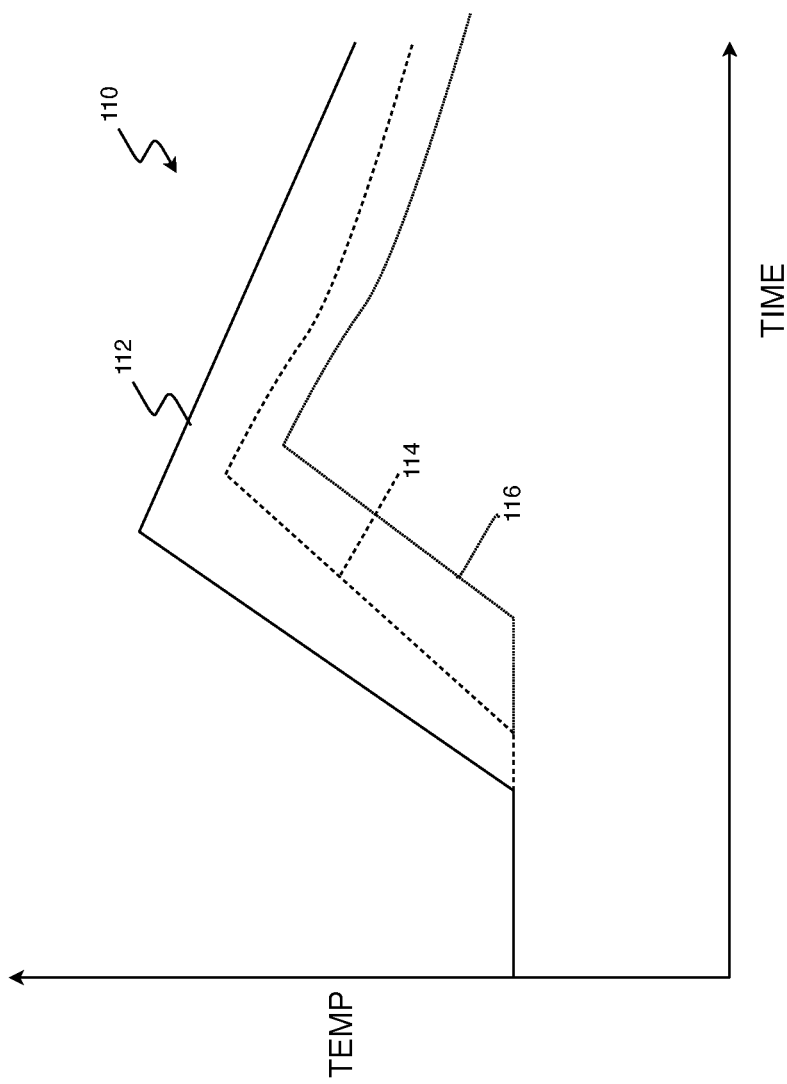

METHOD OF MONITORING A SURFACE CONDITION OF A COMPONENT

CROSS-REFERENCE TO RELATED APPLICATION

This application claims priority to U.S. provisional application No. 63/019,267 filed on May 2, 2020. The disclosure of the above application is incorporated herein by reference.

FIELD

The present disclosure relates generally to a method of monitoring a surface condition of a component in a thermal system, such as showerheads and/or pedestals within a semiconductor processing chamber.

BACKGROUND

The statements in this section merely provide background information related to the present disclosure and may not constitute prior art.

Emissivity of a material is its effectiveness in emitting energy as thermal radiation. The emissivity of a surface of a system component can change over time. For example, in a semiconductor processing chamber where various deposition processes are performed, chemical reactions of deposition materials generally occur in the semiconductor processing chamber and may cause the deposition materials to be undesirably deposited on the chamber walls, liners, and lids. In fluid conduits, scale may undesirably be built up on the surfaces of the fluid conduits. The emissivity of the surfaces of the system components may gradually be affected by the deposits or scale buildups. When the system components are used to generate or transfer heat, the change in the emissivity of the surfaces of the system components can affect the desired heat output and the performance of the system components.

However, the changes in emissivity of the surfaces of the system components are typically not well understood. When the system components are significantly degraded due to the changes in emissivity, system maintenance is required to replace the degraded components, resulting in unexpected downtime. To maintain the performance of the system components and/or reduce/inhibit downtime, preventive maintenance is generally scheduled for cleaning, refurbishment or replacement of critical components based on an expected rate of change, rather than based on actual needs. Therefore, the preventive maintenance may be performed too late or too early.

The issues with detecting changes in emissivity of surfaces of components of an apparatus, among other issues, are addressed by the present disclosure.

SUMMARY

In one form, a method includes providing thermal energy to a component, determining a thermal response of the component in response to providing the thermal energy, and determining a thermal characteristic of the component based on a reference thermal response and the thermal response. The method includes predicting a surface condition of the component based on the thermal characteristic and a predictive analytic model, where the predictive analytic model correlates the thermal characteristic of the component to an estimated surface condition of the component.

In one form, the thermal characteristic is based on a difference between the reference thermal response and the thermal response.

In one form, the thermal characteristic is an emissivity of the component, a thermal coupling among different zones of the component, a thermal gain of the component, an electric resistance-temperature correlation of the component, a gas convective coupling of the component, or a combination thereof.

In one form, providing the thermal energy to the component further includes increasing thermal energy provided to the component.

In one form, providing the thermal energy to the component further includes decreasing thermal energy provided to the component.

In one form, the surface condition indicates an amount of material buildup on a surface of the component.

In one form, the thermal response is a rate of dissipation of thermal energy by the component.

In one form, the method further includes varying at least one of an intensity and a duration of the thermal energy to create a thermal signature of the component, where the thermal signature is an image representation of the thermal response.

In one form, the method further includes determining the thermal characteristic of the component based on a reference thermal signature and the thermal signature.

In one form, the component is selected from a group consisting of a wall of a semiconductor processing chamber, a liner of the semiconductor processing chamber, a showerhead of the semiconductor processing chamber, a lid of the semiconductor processing chamber, a wall of a fluid heating conduit, a heater surface, and a sheath of a heater.

In one form, the method further includes measuring a temperature of the component during a predetermined period to determine the thermal response.

In one form, the method further includes determining a dissipation of energy by the component based on a change in the temperature of the component during the predetermined period.

In one form, the method further includes determining a change in emissivity of the component based on the change in the temperature of the component during the predetermined period.

In one form, the thermal response of the component is determined in response to a temperature of the component being equal to a predetermined temperature.

The present disclosure provides a system including a component, a thermal control system configured to provide thermal energy to the component, and a controller. The controller is configured to determine a thermal response of the component in response to providing the thermal energy, where the thermal response is a rate of dissipation of the thermal energy by the component. The controller is configured to determine a thermal characteristic of the component based on a difference between a reference thermal response and the thermal response, where the reference thermal response is a reference rate of dissipation of the thermal energy of the component in response to providing the thermal energy. The controller is configured to predict an amount of material buildup on a surface of the component based on the thermal characteristic and a predictive analytic model, where the predictive analytic model correlates the thermal characteristics of the component to an estimated surface condition of the component.

In one form, the thermal characteristic is an emissivity of the component, a thermal coupling among different zones of the component, a thermal gain of the component, an electric resistance-temperature correlation of the component, a gas convective coupling of the component, or a combination thereof.

In one form, the component is selected from a group consisting of a wall of a semiconductor processing chamber, a liner of the semiconductor processing chamber, a showerhead of the semiconductor processing chamber, a lid of the semiconductor processing chamber, a wall of a fluid heating conduit, a heater surface, and a sheath of a heater.

In one form, the thermal control system further comprises a heater configured to provide the thermal energy to the component.

In one form, the predictive analytic model is generated during a training routine.

In one form, the component is a semiconductor processing system component.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 4B is a graphical illustration of a measured thermal response of a plurality of components and a reference thermal response of a component in accordance with the teachings of the present disclosure;

Figure 1:
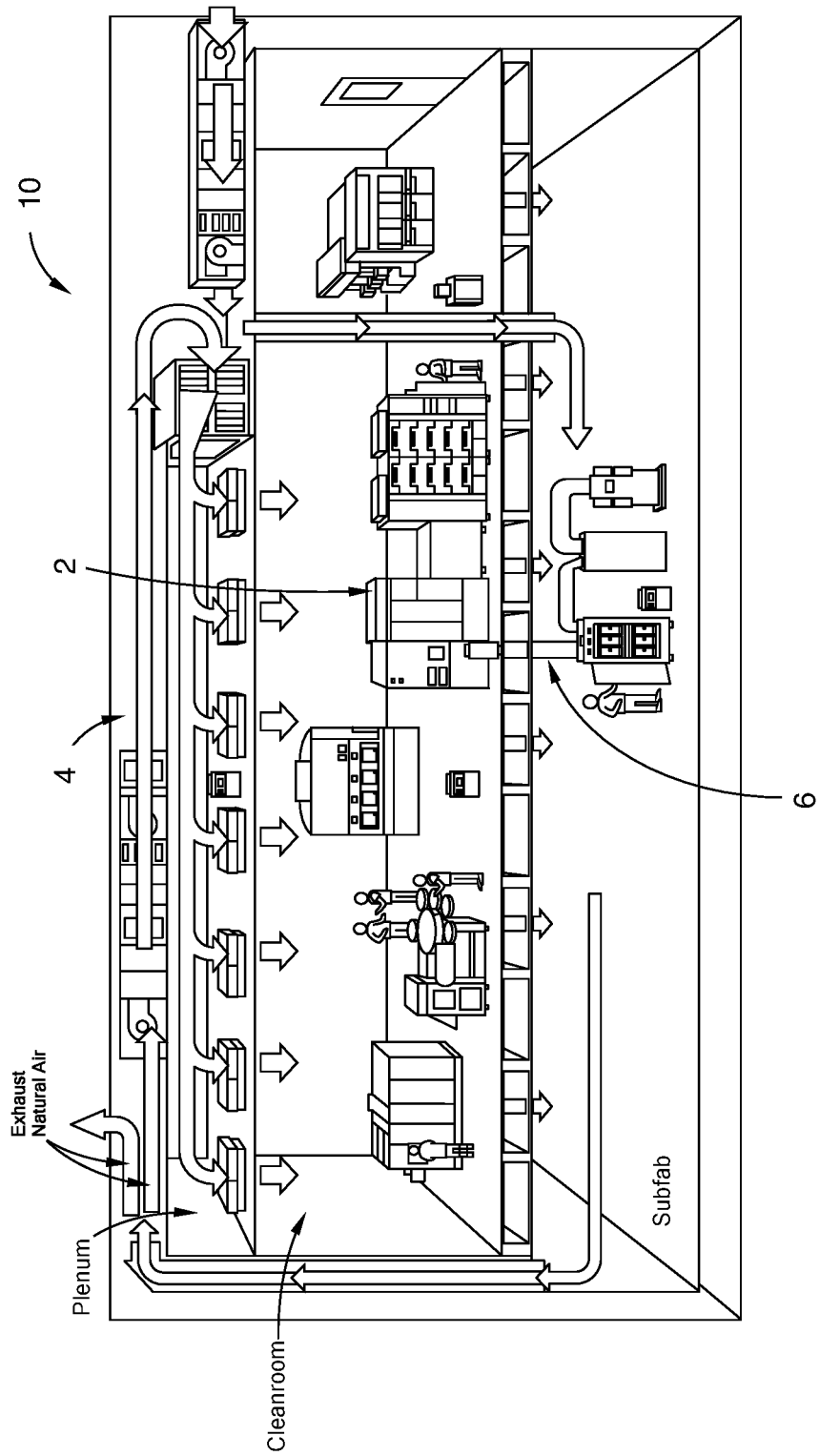
FIG. 1 is an example semiconductor process lab in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure provides a monitoring system that is configured to monitor thermal characteristic(s) of a component, such as emissivity, to predict a surface condition of the component. For example, in a semiconductor processing system, coking in a heater or other components of the semiconductor processing system can increase the emissivity and reduce the convective heat transfer rate, thereby causing the heaters to operate at higher temperatures and with increased energy consumption. The monitoring system of the present disclosure can accurately detect coking in the heater or the other components of the semiconductor processing system and alert an operator and/or a system controller of the detected condition. Furthermore, the monitoring system can accurately localize the material buildup on various components of the semiconductor processing system, thereby enabling the operator and/or the system controller to accommodate for and/or remedy the material buildup when implementing control parameters for a semiconductor manufacturing process routine.

More particularly, in one form, the monitoring system provides thermal energy to a component, determines a thermal response of the component in response to providing the thermal energy, and determines a thermal characteristic of the component based on a reference thermal response and the thermal response. The monitoring system then predicts a surface condition of the component based on the thermal characteristic and a predictive analytic model, where the predictive analytic model correlates a plurality of thermal characteristics of the component to a plurality of estimated surface conditions of the component.

Referring to FIG. 1, in an example application, the control system of the present disclosure is provided in a semiconductor processing system 10 that includes at least one chamber 2 having one or more heaters (not shown) disposed therein. While not illustrated, one or more control systems are provided to control the heaters. The semiconductor processing system 10 includes other subsystems for processing semiconductor wafers, and those subsystems may influence the thermal response of the heaters. For example, a fluid line system, having delivery lines 4 and exhaust lines 6, transports process gases to and from the chamber 2.

Figure 2:
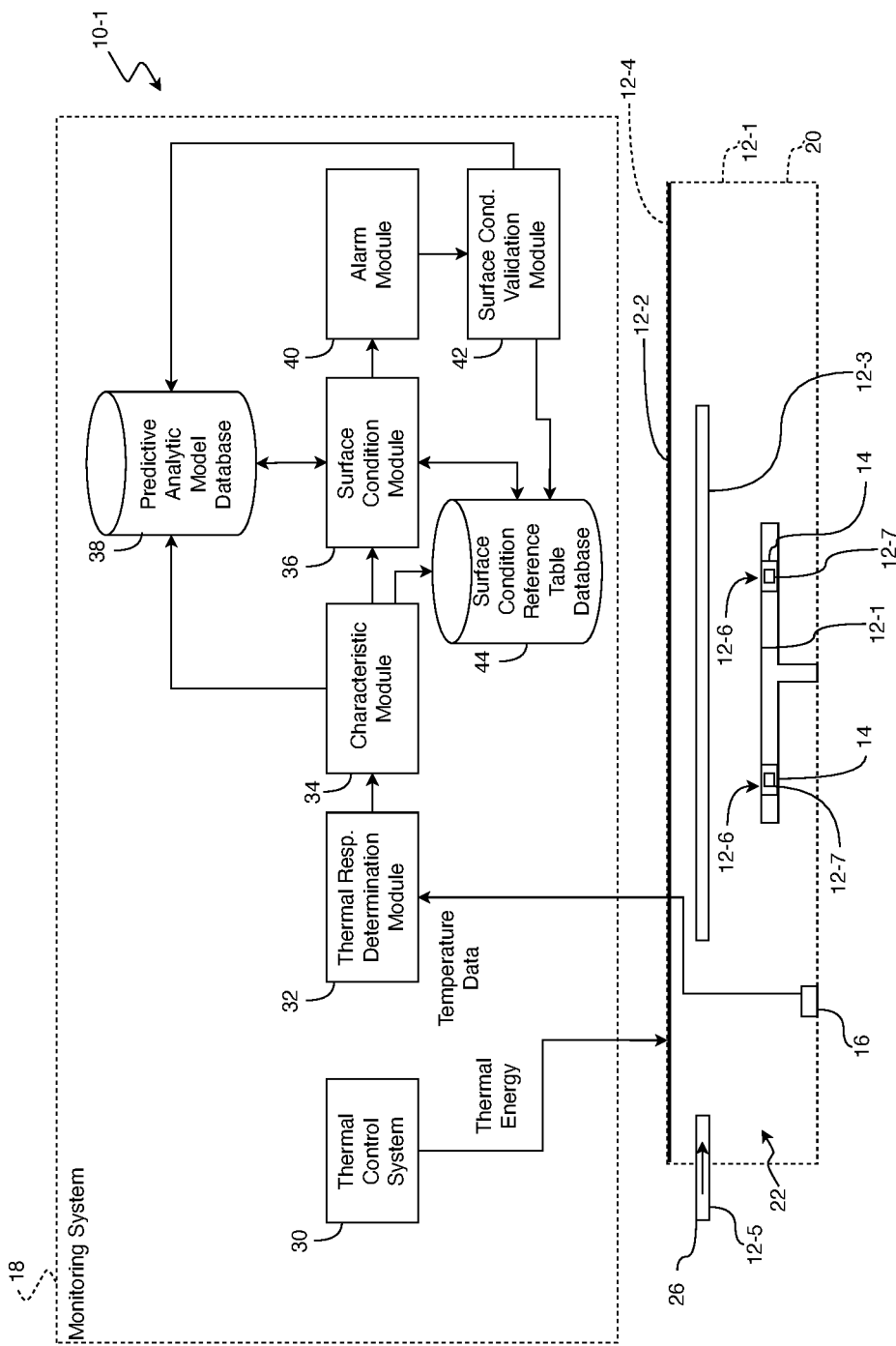
FIG. 2 is a diagram of a semiconductor processing chamber and a monitoring system in accordance with the teachings of the present disclosure.

Referring to FIG. 2, a semiconductor processing system 10-1 is further configured to monitor a surface condition of a component and includes at least one heater 14, a plurality of temperature sensors 16, and a monitoring system 18 for monitoring and predicting the surface condition of the component. In one form, the component may be various system components of a semiconductor processing chamber 22 and/or a heating conduit of the semiconductor processing system 10-1. As an example, the component may be a wall 12-1 of a semiconductor processing chamber 22, a liner 12-2 of the semiconductor processing chamber 22, a showerhead 12-3 of the semiconductor processing chamber 22, a lid 12-4 of the semiconductor processing chamber 22, a wall 12-5 of a fluid heating conduit 26, a top layer 12-6 of a wafer support pedestal 20, a surface of the heater 14, and/or a sheath 12-7 of the heater 14 (collectively/individually and hereinafter referred to as "the component 12").

In one form, the surface condition of the component 12 may be an amount of material buildup or deposits on a surface of the component 12. In one form, the material buildup or deposits affect the emissivity of the surface of the component 12 and the thermal transfer from the surface of the component 12 to the surrounding environment (e.g., a wafer disposed on the wafer support pedestal 20). Therefore, the monitoring system 18 is configured to monitor changes in the thermal characteristics of the surface of the component 12 and thereby predict the state and/or amount of the material buildup and deposits on the surface of the component 12, as described below in further detail. In one form, the thermal characteristics include, but are not limited to: an emissivity of the component 12, thermal coupling between multiple zones of the component 12, thermal gains of the component 12, an electric resistance-temperature correlation of the component 12, and gas convective coupling of the component 12. It should be understood that various other thermal characteristics may be determined and the present disclosure is not limited to the example thermal characteristics described herein.

In one form, the at least one heater 14 may be built into the component 12 or disposed externally from the component 12. In one form, the at least one heater 14 may be configured to provide thermal energy to the component 12. As used herein, "providing thermal energy to the component 12" refers to increasing or decreasing thermal energy provided to a surface of the component 12 and/or an environment proximate to (i.e., adjacent and/or near) the component 12. As an example, increasing the thermal energy provided to the component 12 may include heating a surface of the component 12 and/or an environment proximate the component 12. As another example, decreasing the thermal energy provided to the component 12 may include cooling a surface of the component 12 and/or an environment proximate the component 12. While the semiconductor processing system 10-1 is shown as including the at least one heater 14, it should be understood that the heater 14 may be removed from the semiconductor processing system 10-1 when thermally energy is externally provided to the fluid (e.g., gas) via the fluid heating conduit 26 to provide plasma into the semiconductor processing chamber 22.

In one form, the plurality of temperature sensors 16 may be built into the component 12 or disposed externally from the component 12 for measuring temperatures of the surface and/or ambient environment of the component 12. As an example, the temperature sensors 16 may include, but are not limited to: thermocouples, resistance temperature detectors (RTDs), infrared sensors, and/or other conventional temperature sensing devices. In one form, the temperature sensors 16 are "two-wire" heaters that are built into the component 12 (e.g., the wafer support pedestal 20). The two-wire heaters include resistive heating elements that function as heaters and as temperature sensors with only two leads wires operatively connected to the heating element rather than four. Such two-wire capability is disclosed in, for example, U.S. Pat. No. 7,196,295, which is commonly assigned with the present application and incorporated herein by reference in its entirety. Typically, in a two-wire system, the resistive heating elements are defined by a material that exhibits a varying resistance with varying temperature such that an average temperature of the resistive heating element is determined based on a change in resistance of the resistive heating element. In one form, the resistance of the resistive heating element is calculated by first measuring the voltage across and the current through the heating elements and then, using Ohm's law, the resistance is determined. The resistive heating element may be defined by a relatively high temperature coefficient of resistance (TCR) material, a negative TCR material, or in other words, a material having a non-linear TCR.

In one form, the monitoring system 18 includes a thermal control system 30, a thermal response determination module 32, a characteristic module 34, a surface condition module 36, a predictive analytic model database 38, an alarm module 40, a surface condition validation module 42, and a surface condition reference table database 44. It should be readily understood that any one of the modules, systems, and/or databases of the monitoring system 18 can be provided at the same location or distributed at different locations (e.g., via one or more edge computing devices) and communicably coupled accordingly. While the monitoring system 18 is illustrated as part of the semiconductor processing system 10-1, it should be understood that the monitoring system 18 may be positioned remotely from the semiconductor processing system 10-1. In one form, monitoring system 18 and the temperature sensors 16 are communicably coupled using a wired communication protocol and/or a wireless communication protocol (e.g., a Bluetooth®-type protocol, a cellular protocol, a wireless fidelity (Wi-Fi)-type protocol, a near-field communication (NFC) protocol, an ultra-wideband (UWB) protocol, among others).

In one form, the thermal control system 30 is configured to control an operation of the heater 14 and/or fluid flow provided into the semiconductor processing chamber 22 via the fluid heating conduit 26. As an example, the thermal control system 30 may include a power supply and one or more power converter circuits to provide power to the heater 14 and thus, provide the thermal energy to the component 12. Accordingly, to perform the functionality described herein, the thermal control system 30 may include one or more processors configured to execute instructions stored for in a nontransitory computer-readable medium (e.g., a random-access memory (RAM) and/or a read-only memory (ROM)) and to control the power converter circuits and the power supply. As another example, the thermal control system 30 may control a radio frequency (RF) plasma generator (not shown) to increase/decrease the thermal energy provided to the fluid heating conduit 26. In one form, the thermal control system 30 provides the thermal energy until a setpoint temperature of the component 12, an ambient environment of the component 12, and/or another component of the semiconductor processing chamber 22 is reached. In one variation, the monitoring system 18 is in communication with the thermal control system 30 or a controller thereof that is provided in an existing semiconductor processing system.

In one form, the thermal response determination module 32 is configured to receive the temperature data obtained by the temperature sensors 16 and determine a thermal response of the component 12 in response to the thermal control system 30 providing thermal energy to the component 12. In one form, the thermal response of the component 12 refers to the rate at which the component 12 dissipates the thermal energy to the surrounding environment after the thermal energy is provided to the component 12. As an example, the thermal response determination module 32 is configured to determine a rate at which the component 12 dissipates the thermal energy as a function of a temperature change over a given time period. In some forms, the thermal response may be determined when the temperature of the component 12 is equal to a predetermined temperature and/or during a predetermined time period, as described below in further detail. In one form, the thermal response refers to parameters of a system providing the thermal energy (e.g., a voltage, current, electric resistance, and/or other parameter of the heater 14 when it provides the thermal energy).

Figure 3:
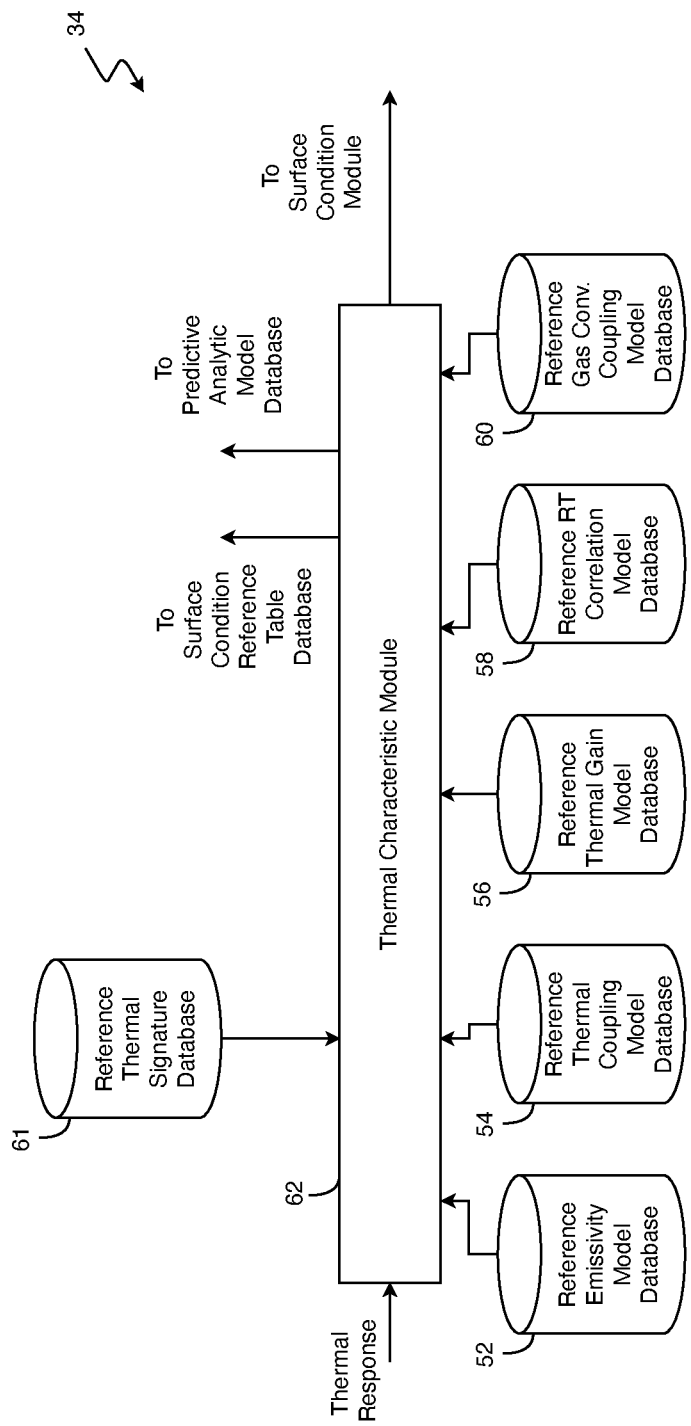
FIG. 3 is a functional block diagram of a thermal response determination module in accordance with the teachings of the present disclosure.

In one form and as shown in FIG. 3A, the characteristic module 34 is configured to determine a thermal characteristic of the component 12 and includes a reference emissivity model database 52, a reference thermal coupling model database 54, a reference thermal gain model database 56, a reference RT correlation model database 58, a reference gas convection coupling model database 60, a reference thermal signature database 61, and a thermal characteristic module 62.

In one form, the reference emissivity model database 52 stores a reference emissivity model of the component 12. As an example, the reference emissivity model may represent the emissivity of the component 12 when there is no material buildup on the surface of the component 12. It should be understood that the reference emissivity model database 52 may include additional reference emissivity models that represent the emissivity of the component 12 when a predetermined amount of material buildup is located on the surface of the component 12.

In one form, the reference thermal coupling model database 54 stores a reference thermal coupling model of the component 12. As an example, the reference thermal coupling model may represent the thermal coupling between the component 12 and another component (e.g., conduction rates, convection rates, and radiation rates between two adjacent and/or spaced components 12 and/or heaters 14) when there is no material buildup on the surface of the component 12. It should be understood that the reference thermal coupling model database 54 may include additional reference thermal coupling models that represent the thermal coupling of the component 12 with various components within the semiconductor processing system 10-1 and/or various amounts of material buildup located on the surface of the component 12.

In one form, the reference thermal gain model database 56 stores a reference thermal gain model of the component 12. As an example, the reference thermal gain model may represent the thermal gain of the component 12 at a given temperature when there is no material buildup on the surface of the component 12. It should be understood that the reference thermal gain model database 56 may include additional reference thermal gain models that represent the thermal gain of the component 12 at various temperatures and/or various amounts of material buildup located on the surface of the component 12.

In one form, the reference RT correlation model database 58 stores a reference electric resistance-temperature correlation model of the component 12. As an example, the reference electric-resistance temperature correlation model may represent a correlation between an electrical resistance and the temperature of the component 12 when there is no material buildup on the surface of the component 12. It should be understood that the reference RT correlation model database 58 may include additional reference electric resistance-temperature models that represent the electric resistance-temperature correlation of the component 12 when a predetermined amount of material buildup is located on the surface of the component 12.

In one form, the reference gas convection coupling model database 60 stores a reference gas convection coupling model of the component 12. As an example, the reference gas convection coupling model may represent a transfer of heat from the fluid (e.g., gas) provided via the fluid heating conduit 26 and/or plasma to the component 12 when there is no material buildup on the surface of the component 12. It should be understood that the reference gas convection coupling model database 60 may include additional reference gas convection coupling models that represent the transfer of heat from the fluid (e.g., gas) provided via the fluid heating conduit 26 and/or plasma to the component 12 when a predetermined amount of material buildup is located on the surface of the component 12.

In one form, the reference emissivity model(s), the reference thermal coupling model(s), the reference thermal coupling model(s), the reference thermal gain model(s), the reference RT correlation model(s), and the reference gas convection coupling model(s) (collectively referred to herein as "reference models") are generated during a calibration routine performed by the monitoring system 18 and/or during a machine-learning routine performed by the surface condition module 36, as described below in further detail.

In one form, the reference thermal signature database 61 stores a reference thermal signature of the component 12. As an example, the reference thermal signature is an image representation of the thermal response when varying at least one of an intensity and a duration of the thermal energy provided to the component 12 when there is no material buildup on the surface of the component 12. It should be understood that the reference thermal signature database 61 may store additional reference thermal signatures of the component 12 that correspond to a predetermined amount of material buildup located on the surface of the component 12.

Figure 4A:
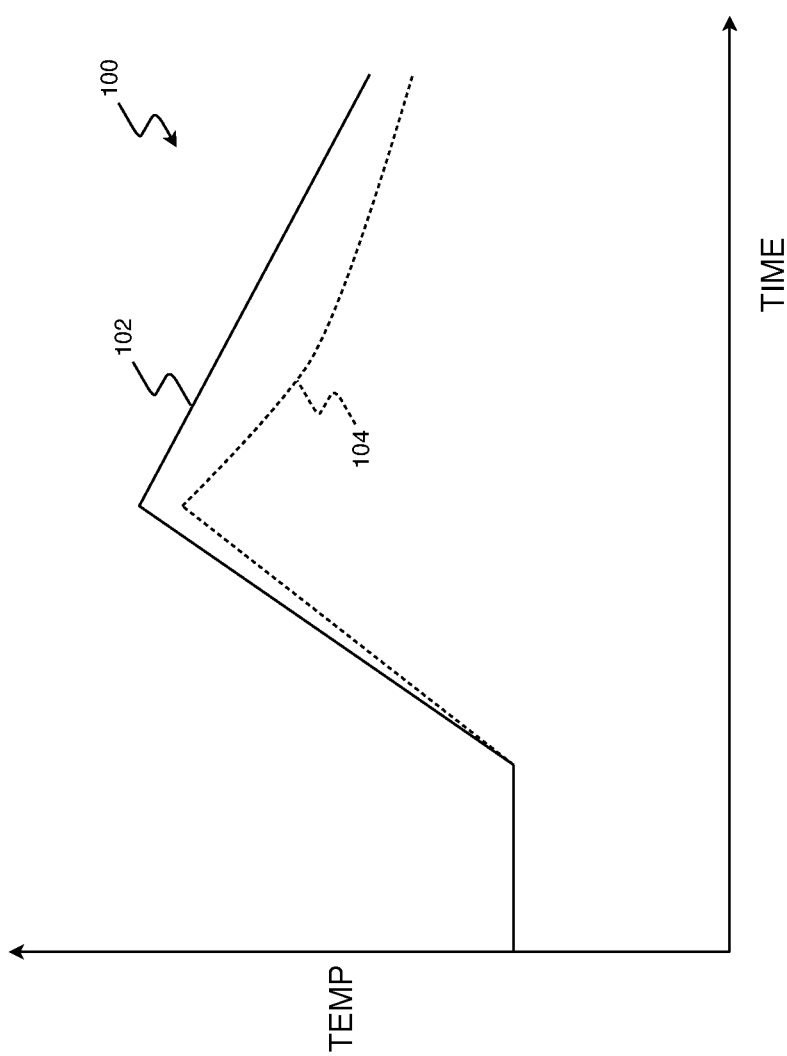
FIG. 4A is a graphical illustration of a measured thermal response and a reference thermal response of a component in accordance with the teachings of the present disclosure.

In one form, the thermal characteristic module 62 is configured to determine a thermal characteristic of the component 12 based on a difference between the thermal response and one or more of the reference models. In one form, the thermal characteristic module 62 may compare the thermal response to the reference emissivity model(s) to determine whether the emissivity of the component 12 has changed. As an example and as shown in graph 100 of FIG. 4A, the thermal characteristic module 62 may determine that the emissivity of the component 12 has changed based on a reference emissivity model 102 of the component 12 and a thermal response 104 of the component 12, which illustrates a lower maximum temperature and a faster decay rate of the temperature over a given period of time.

As another example and as shown in graph 110 of FIG. 4B, a second component (e.g., the heater 14) of the semiconductor processing system 10 may receive thermal energy, and the temperature sensors 16 may monitor the rate of temperature change of the second component, as indicated by thermal response 112. Furthermore, a reference emissivity model 116 may correspond to an expected thermal response of a given component 12 when the second component receives the thermal energy. Accordingly, the thermal characteristic module 62 may determine that the emissivity of the component 12 has changed based on thermal response 114, which illustrates a higher local maximum temperature over a given period of time.

As another example, the thermal characteristic module 62 may create a thermal signature of the component 12 based on the thermal response data and compare the thermal signature to one or more of the reference thermal signatures to determine whether the emissivity, the thermal coupling, etc., of the component 12 has changed. In one form, thermal signatures of shorter energy pulses are associated with features intimate with a heating element (e.g. the heater sheath or features in conductive contact), and thermal signatures of longer energy pulses are associated with higher decoupling, such as features that are heated radiatively. It should be understood that the thermal characteristic module 62 may compare the thermal response to any one of the reference models to determine whether a change in the corresponding thermal characteristic is present.

Referring back to FIG. 2, the surface condition module 36 is configured to predict a surface condition of the component 12 based on the thermal characteristic. Furthermore, the surface condition module 36 is configured to predict the surface condition based on at least one of a surface condition reference table stored in the surface condition reference table database 44 and a predictive analytic model stored in the predictive analytic model database 38.

In one form, the surface condition reference table is a lookup table that correlates various thermal characteristics of the component 12 to various empirically obtained surface conditions of the component 12. As such, an operator may generate the lookup table by depositing various known amounts and/or distribution patterns of materials onto the component 12 and comparing, for example, the emissivity change for the known amounts of materials to the reference emissivity model. As such, the surface condition module 36 may reference the surface condition reference table to identify a corresponding thermal characteristic change (e.g., an emissivity change) and predict the corresponding surface condition of the component 12 (e.g., an amount and/or distribution of material buildup on a surface of the component 12). In some forms, the monitoring system 18 may not have the surface condition reference table database 44 to store the surface condition reference table.

In one form, the predictive analytic model correlates various thermal characteristics of the component 12 to various estimated surface conditions of the component 12. In one form, the surface condition module 36 may include an artificial neural network, a convolutional neural network, and/or other similar machine-learning computing system that is configured to perform a machine learning routine, such as a supervised learning routine, an unsupervised learning routine, a reinforcement learning routine, self-learning routines, black-box modeling routines, among others, to generate the predictive analytic model. During the machine learning routine, the thermal control system 30 may provide thermal energy to the component 12 in pulses, in steps, or in ramps, with periodic or aperiodic timing and/or varying amplitudes. As such, the supervised learning routine may be performed such that behaviors due to unknown model parameters (e.g., power applied, gas flow adjacent to the component 12, gas pressure adjacent to the component 12, thermal energy in pulses, steps, ramps, periodic or aperiodic timing, varying amplitude of the pulse of thermal energy) are expressed in the thermal response.

As an example, when the surface condition module 36 performs a supervised learning routine, known quantities and/or distribution of materials on a surface of the component 12 are used to develop the predictive analytic model that correlates the quantity/distribution of materials and/or other unknown model parameters to the changes in the thermal characteristic (e.g., thermal coupling changes). Furthermore, the supervised learning routine may be iteratively performed for various quantities/distributions to improve the accuracy of the predictive analytic model.

As another example, when the surface condition module 36 performs an unsupervised learning routine (e.g., the surface condition module 36 is an autoencoder neural network that performs an unsupervised learning routine), unknown quantities and/or distributions of materials deposited on the component 12 are used to develop the predictive analytic model that correlates the quantity/distribution of materials and/or other unknown model parameters to the changes in the thermal characteristic (e.g., emissivity changes).

Accordingly, the predictive analytic model enables the surface condition module 36 to predict the surface condition based on emissivity changes (or other thermal characteristic changes) of the component 12. As an example, the surface condition module 36 correlates the determined emissivity changes of the component 12 to the predictive analytic model to predict whether the emissivity change is "normal" (i.e., the rate of heat dissipation is within a predetermined and/or expected range due to reduced or less than expected material buildup on the surface of the component 12) or "abnormal" (i.e., the rate of heat dissipation is greater than a predetermined and/or expected range due to increased or more than expected material buildup on the surface of the component 12). It should be understood that the surface condition module 36 may characterize the component 12 using various other qualitative and/or quantitative property descriptions based on the predictive analytic model and is not limited to the examples described herein.

In one form, the alarm module 40 includes various user interfaces for indicating the presence of material buildup on the surface of the component 12. As an example, the alarm module 40 may include various visual interfaces (e.g., a touchscreen, a display monitor, an augmented reality device, and/or a plurality of light-emitting diodes (LEDs)), auditory interfaces (e.g., a speaker circuit for auditorily outputting messages corresponding to the material buildup), and/or haptic interfaces (e.g., a vibration motor circuit that vibrates when the material buildup is greater than a threshold value).

In one form, the surface condition validation module 42 is configured to validate and/or calibrate the predictive analytic model and/or the surface condition reference table when the alarm module 40 outputs a signal indicating material buildup on the surface of the component 12. As an example, the surface condition validation module 42 includes a visual interface, such as a touchscreen device, that provides the operator to view the predicted amount/distribution of material buildups and validate. Furthermore, the visual interface of the surface condition validation module 42 may include one or more manipulatable graphical elements that enable an operator to validate the predictions and/or adjust the parameters of the predictive analytic model and/or the surface condition reference table. In some forms, the monitoring system 18 may not have the surface condition validation module 42 to monitor the surface condition of the component 12.

Figure 5:
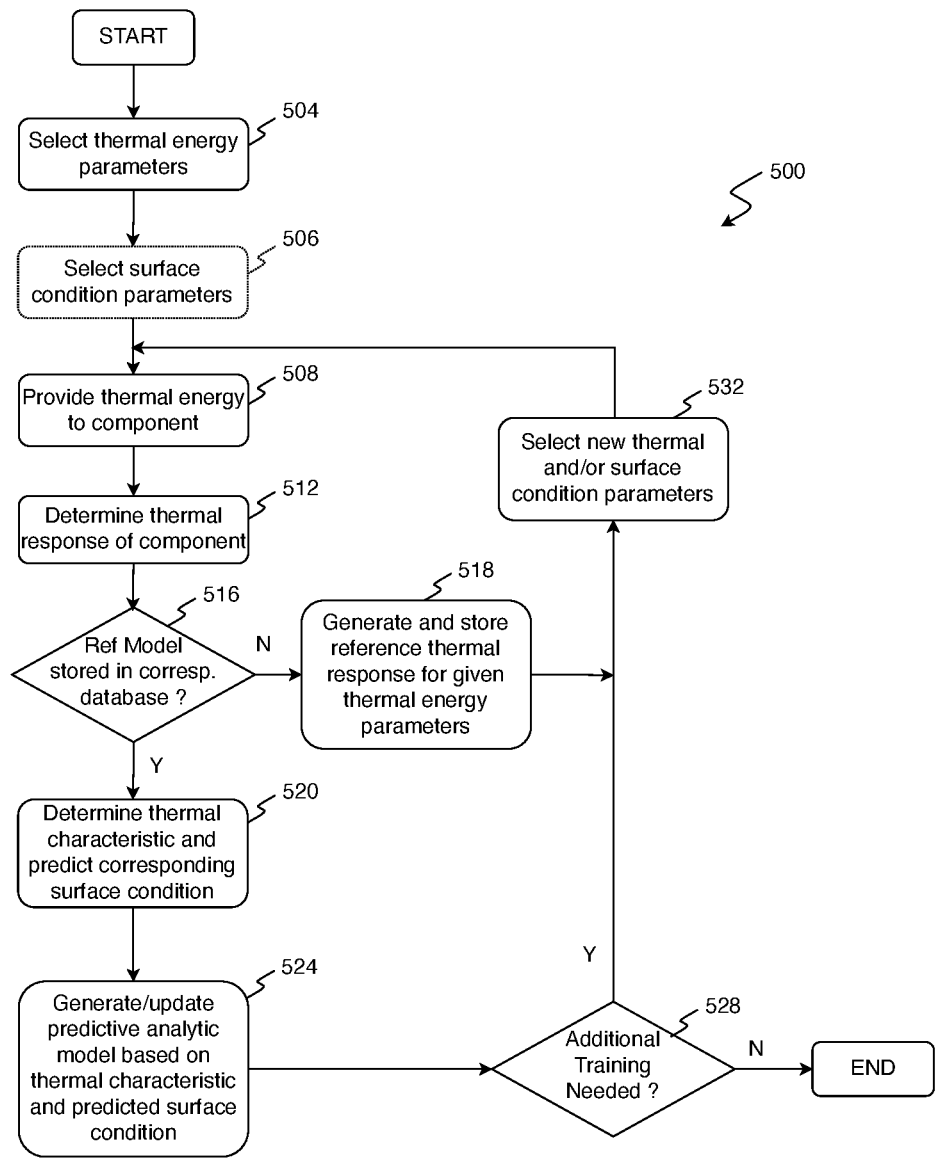
FIG. 5 is a flowchart of an example training routine performed by a monitoring system in accordance with the teachings of the present disclosure.

With reference to FIG. 5, a flowchart illustrating an example training routine 500 is shown. At 504, the thermal control system 30 or an operator thereof selects the thermal energy parameters (e.g., the pulse, amplitude, duration, etc.). Optionally, when a supervised learning routine is performed, the surface condition module 36 or an operator thereof selects the surface condition parameters (e.g., an amount and/or distribution of material buildup on the component 12) at 506. At 508, the thermal control system 30 provides the thermal energy to the component 12, and the thermal response determination module 32 determines the thermal response of the component 12 at 512.

At 516, the characteristic module 34 determines whether a reference model associated with the component 12 and/or thermal response is stored in the corresponding database (i.e., one of the reference emissivity model database 52, the reference thermal coupling model database 54, the reference thermal gain model database 56, the reference RT correlation model database 58, the reference gas convection coupling model database 60, and the reference thermal signature database 61). If so, the routine 500 proceeds to 520. Otherwise, if no reference model is stored in the corresponding database, the routine 500 proceeds to 518, where the characteristic module 34 generates and stores a reference thermal response for the given thermal energy parameters and then proceeds to 532.

At 520, the characteristic module 34 determines the thermal characteristic of the component 12 based on the thermal response and the reference thermal response, and the surface condition module 36 predicts the corresponding surface condition based on the thermal characteristic and the predictive analytic model. At 524, the surface condition module 36 generates/updates the predictive analytic model based on the thermal characteristic and the associated surface condition. At 528, the surface condition module 36 determines whether additional training is needed. If so, the routine 500 proceeds to 532, where the monitoring system 18 receives a selection of new thermal energy parameters and/or surface condition parameters and proceeds to 508. Otherwise, the routine 500 ends.

Figure 6:
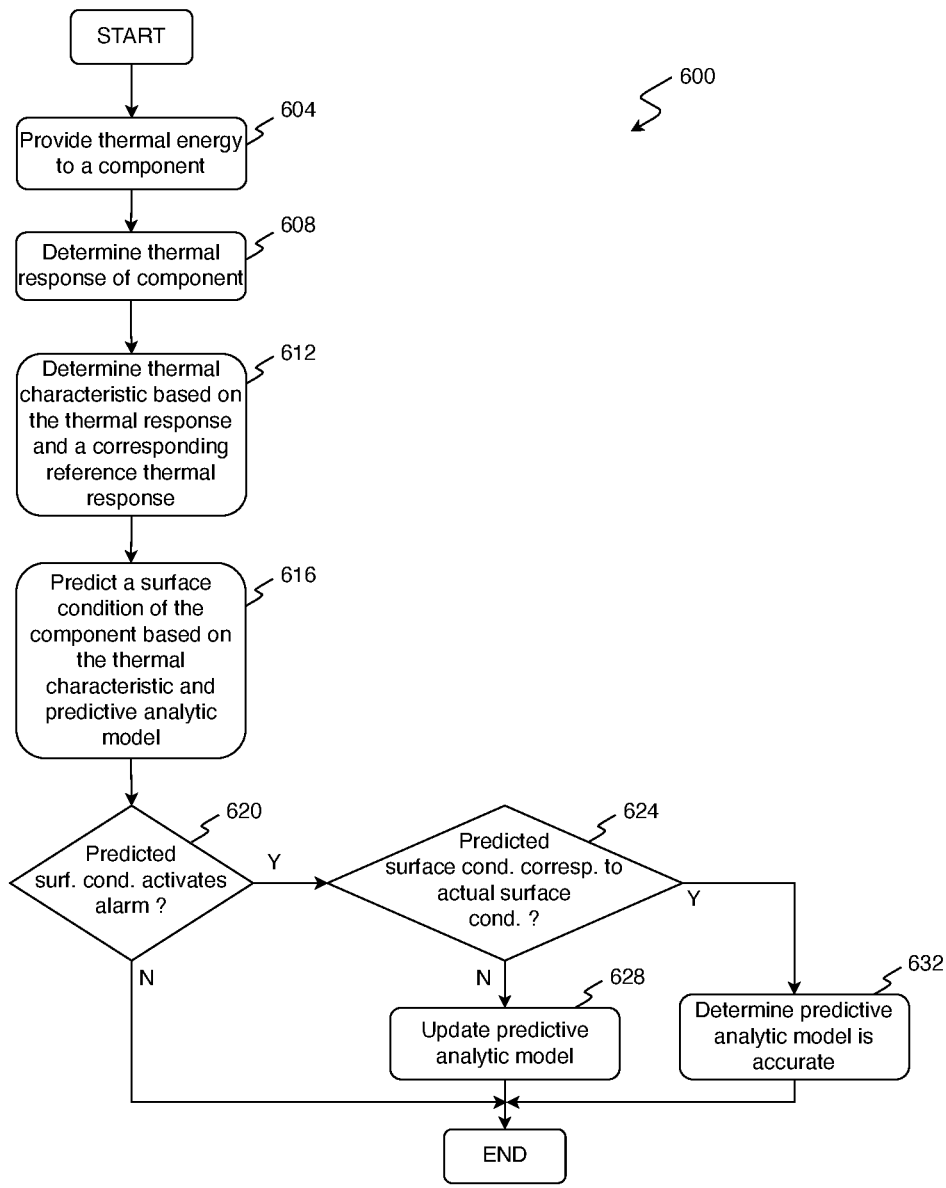
FIG. 6 is a flowchart of an example surface condition prediction routine performed by a monitoring system in accordance with the teachings of the present disclosure.

With reference to FIG. 6, a flowchart illustrating an example surface condition prediction routine 600 performed by the surface condition module 36 is shown. As an example, the surface condition prediction routine 600 may be performed while the semiconductor processing system 10-1 operates, at periodic intervals, and/or at other various time intervals. At 604, the thermal control system 30 provides the thermal energy to the component 12, and the thermal response determination module 32 determines the thermal response of the component 12 at 608. At 612, the characteristic module 34 determines the thermal characteristic of the component 12 based on the thermal response and the reference thermal response. At 616, the surface condition module 36 predicts the corresponding surface condition based on the thermal characteristic and the predictive analytic model.

At 620, the monitoring system 18 determines whether the predicted surface condition activates the alarm module 40. If so, the routine 600 proceeds to 624. Otherwise, if the alarm module 40 is not activated at 620, the routine 600 ends. At 624, the surface condition validation module 42 determines whether the predicted surface condition corresponds to the actual surface condition of the component 12. If so, the routine 600 proceeds to 632, where the surface condition validation module 42 determines the predictive analytic model is accurate. If the predicted surface condition does not correspond to the actual surface condition of the component 12 at 624, the surface condition validation module 42 updates the predictive analytic model at 628.

It should be understood that the routines 500, 600 are merely example routines and that the monitoring system 18 may perform other routines.

While the monitoring system 18 is described herein as predicting the surface condition of the component 12 of the semiconductor processing system 10, it should be understood that the monitoring system 18 may be used in other environments and is not limited to the semiconductor processing system 10 described herein.

The monitoring system of the present disclosure detects relative changes in emissivity to thereby create a prognostic preventive maintenance solution based on the detected relative changes in emissivity. Preventive/predictive maintenance can be performed based on the actual changes to various components in the semiconductor processing system as opposed to arbitrary preventive maintenance schedules. Therefore, the monitoring system can reduce maintenance costs and downtime and improve equipment uptime.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, the term controller or module may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality, such as, but not limited to, movement drivers and systems, transceivers, routers, input/output interface hardware, among others; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

What is claimed is:

1. A method for monitoring a surface condition of a component, the method comprising:
   providing, by a heater, thermal energy to the component;
   determining, by a controller, a thermal response of the component in response to providing the thermal energy, wherein the controller comprises one or more processors configured to execute instructions stored in a nontransitory computer-readable medium;

determining, by the controller, a thermal characteristic of the component based on a reference thermal response and the thermal response; and predicting, by the controller, the surface condition of the component based on the thermal characteristic and a predictive analytic model, wherein the predictive analytic model correlates the thermal characteristics of the component to an estimated surface condition of the component, and wherein the predictive analytic model is generated by a machine learning routine that correlates one or more model parameters of a semiconductor processing system to changes in the thermal characteristic.

2. The method according to claim 1, wherein the thermal characteristic is based on a difference between the reference thermal response and the thermal response.

3. The method according to claim 1, wherein the thermal characteristic is an emissivity of the component, a thermal coupling among different zones of the component, a thermal gain of the component, an electric resistance-temperature correlation of the component, a gas convective coupling of the component, or a combination thereof.

4. The method according to claim 1, wherein providing the thermal energy to the component further comprises increasing thermal energy provided to the component.

5. The method according to claim 1, wherein providing the thermal energy to the component further comprises decreasing thermal energy provided to the component.

6. The method according to claim 1, wherein the surface condition indicates an amount of material buildup on a surface of the component.

7. The method according to claim 1, wherein the thermal response is a rate of dissipation of thermal energy by the component.

8. The method according to claim 1 further comprising varying at least one of an intensity and a duration of the thermal energy to create a thermal signature of the component, wherein the thermal signature is an image representation of the thermal response.

9. The method according to claim 8 further comprising determining the thermal characteristic of the component based on a reference thermal signature and the thermal signature.

10. The method according to claim 1, wherein the component is selected from a group consisting of a wall of a semiconductor processing chamber, a liner of the semiconductor processing chamber, a showerhead of the semiconductor processing chamber, a lid of the semiconductor processing chamber, a wall of a fluid heating conduit, a heater surface, and a sheath of the heater.

11. The method according to claim 1 further comprising measuring a temperature of the component during a predetermined period to determine the thermal response.

12. The method according to claim 11 further comprising determining a dissipation of energy by the component based on a change in the temperature of the component during the predetermined period.

13. The method according to claim 12 further comprising determining a change in emissivity of the component based on the change in the temperature of the component during the predetermined period.

14. The method according to claim 1, wherein the thermal response of the component is determined in response to a temperature of the component being equal to a predetermined temperature.

15. A monitoring system for monitoring a surface condition of a component, the monitoring system comprising:

a thermal control system comprising a heater, wherein the heater is configured to provide thermal energy to the component, and wherein the component is selected from a group consisting of a wall of a semiconductor processing chamber, a liner of the semiconductor processing chamber, a showerhead of the semiconductor processing chamber, a lid of the semiconductor processing chamber, a wall of a fluid heating conduit, a heater surface, and a sheath of the heater; and a controller comprising one or more processors configured to execute instructions stored in a nontransitory computer-readable medium, wherein the controller is configured to:

determine a thermal response of the component in response to providing the thermal energy, wherein the thermal response is a rate of dissipation of the thermal energy by the component;

determine a thermal characteristic of the component based on a difference between a reference thermal response and the thermal response, wherein the reference thermal response is a reference rate of dissipation of the thermal energy of the component in response to providing the thermal energy; and predict an amount of material buildup on a surface of the component based on the thermal characteristic and a predictive analytic model, wherein the predictive analytic model correlates the thermal characteristics of the component to an estimated surface condition of the component, and wherein the predictive analytic model is generated by a machine learning routine that correlates one or more model parameters of a semiconductor processing system to changes in the thermal characteristic.

16. The system according to claim 15, wherein the thermal characteristic is an emissivity of the component, a thermal coupling among different zones of the component, a thermal gain of the component, an electric resistance-temperature correlation of the component, a gas convective coupling of the component, or a combination thereof.

17. The system according to claim 15, wherein the predictive analytic model is generated during a training routine.

* * * * *